(«12») United States Patent
Camerlenghi et al.

(10) Patent No.: US 6,903,995 B2
(45) Date of Patent: Jun. 7, 2005

(54) TEST STRUCTURE FOR THE MEASUREMENT OF CONTACT TO GATE DISTANCE IN NON-VOLATILE MEMORY DEVICES AND CORRESPONDING TEST METHOD

(75) Inventors: Emilio Camerlenghi, Bergamo (IT); Paolo Cappelletti, Seveso (IT); Tecla Ghilardi, S. Paolo d'Argon (IT); Mauro Sali, S. Agelo Lodigiano (IT); Giorgio Servalli, Ciserano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 67 days.

(21) Appl. No.: 10/449,761

(22) Filed: May 30, 2003

(65) Prior Publication Data

US 2003/0235097 A1 Dec. 25, 2003

(30) Foreign Application Priority Data

May 31, 2002 (EP) .......................................... 02425360

(51) Int. Cl.[7] .................................................. G11C 8/00
(52) U.S. Cl. .................................... 365/230.03; 365/63
(58) Field of Search .............................. 365/230.03, 63

(56) References Cited

U.S. PATENT DOCUMENTS

| | | | |
|---|---|---|---|
| 5,712,816 A | 1/1998 | Cappelletti et al. | 365/185.05 |
| 5,745,417 A * | 4/1998 | Kobayashi et al. | 365/185.29 |
| 6,331,954 B1 | 12/2001 | Wang et al. | 365/185.29 |
| 6,381,167 B2 * | 4/2002 | Ooishi et al. | 365/230.03 |
| 6,549,445 B2 * | 4/2003 | Ooishi et al. | 365/63 |
| 6,754,099 B2 * | 6/2004 | Hidaka | 365/173 |

* cited by examiner

*Primary Examiner*—Michael S. Lebentritt
*Assistant Examiner*—Tuan T. Nguyen
(74) *Attorney, Agent, or Firm*—Lisa K. Jorgenson; Allen, Dyer, Doppelt, Milbrath & Gilchrist, P.A.

(57) ABSTRACT

An integrated non-volatile memory device may include a first matrix of memory cells organized into rows (or word lines) and columns (or bit lines), corresponding row and column decoding circuits, and read, modify and erase circuits for reading and modifying data stored in the memory cells. Furthermore, the memory device may also include a test structure including a second matrix of memory cells smaller than the first. The second memory matrix may include word line couplings each having a different contact to gate distance. That is, each coupling is aligned a different distance from its respective gate than adjacent couplings.

18 Claims, 5 Drawing Sheets

TEST STRUCTURE FOR THE MEASUREMENT OF CONTACT TO GATE DISTANCE IN NON-VOLATILE MEMORY DEVICES AND CORRESPONDING TEST METHOD

FIELD OF THE INVENTION

The present invention relates to semiconductor devices, and, more particularly, to FLASH memory devices. Moreover, the invention relates to an integrated non-volatile memory device including a matrix of cells organized into rows and columns and including corresponding row and column decoding circuits as well as read, modify and erase circuits for reading and modifying data stored in the memory cells. The invention also relates to a test method for measuring a contact to gate distance in a non-volatile memory device.

By way of example, the invention is particularly well suited for use with complementary metal oxide semiconductor (CMOS) non-volatile FLASH memory devices which are electrically programmable and erasable. The following description will make reference to this exemplary implementation for clarity of explanation, although the invention is applicable to other devices as well.

BACKGROUND OF THE INVENTION

In current manufacturing processes for FLASH memory devices, a cell channel erasing technique is becoming increasingly popular. As will be appreciated by those skilled in the art, this erasing technique involves the application of a large bias (e.g., 14–18 V) between the gates and the substrate of the cells for a period of about 100–500 ms/cycle. The same potential difference is also applied between the word lines of the FLASH memory device and the drain/source contacts.

In the meantime, the contact to gate distance, as illustratively shown in FIG. 1, becomes smaller and smaller as technology allows device sizes to shrink. For example, for 0.13 um technology this distance is below 90 nm. Thus, the quality of the dielectric and the control of the effective contact to gate distance are key points for the reliability size reduction of the FLASH cells.

Furthermore, such variables become more and more critical over the lifetime of the device. That is, if they are not accounted for during manufacturing or during device test, cell performance degradation may result in significant increases in the erasing bias. This variability can even cause the breakdown of the dielectric layer between contacts and gates, as may be seen in FIG. 2.

Presently, the contact to gate distance is monitored during manufacturing through overlay measurements between the contact mask and the word line mask at a few locations on a few wafers of each lot. Yet, there are limitations to this approach. For example, this approach provides relatively few measurement statistics, and the cost of overlay measurement is relatively high. Further, such "in line" measurements are not entirely accurate, since contact to gate distance depends also on contact and word line shape/dimension. Moreover, even if this kind of event is always localized in single defective cells, its failure rate depends largely on the intrinsic thickness of the dielectric between the contact and gate.

SUMMARY OF THE INVENTION

An object of the present invention is to provide a memory device and a test structure for measuring the effective distance between the contact and the gate of the memory cells. As noted above, this distance is extremely important for device reliability, particularly during erasing.

In accordance with the present invention, the test structure may include a second matrix of memory cells, having (on a whole) a smaller size than a first memory matrix, in which the contacts are gradually misaligned toward the word lines. This test structure allows monitoring the critical parameters on every manufactured device during its electrical test (e.g., EWS). This allows the devices to be classified or rejected accordingly based upon the measured contact to gate distance.

Generally speaking, the test structure may be implemented on memory devices to provide an electrical test of intrinsic contact to gate distances. Again, this may be done based upon contact misalignment and contact/gate dimension control.

BRIEF DESCRIPTION OF THE DRAWINGS

Various features and advantages of the test structure and associated method according to the present invention will be understood based upon the following description of an embodiment thereof, given by way of non-limiting example, with reference to the accompanying drawings, in which.

DETAILED DESCRIPTION OF THE PREFERRED EMBODIMENTS

Figure 1:
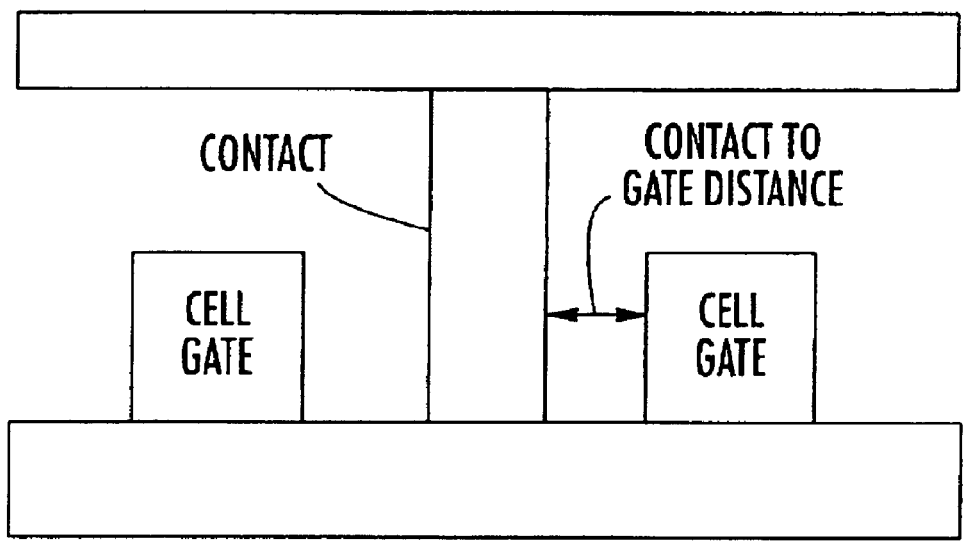
FIG. 1 is a schematic block diagram of a memory cell having a contact close to the gate region of the cell in accordance with the prior art.
Figure 2:
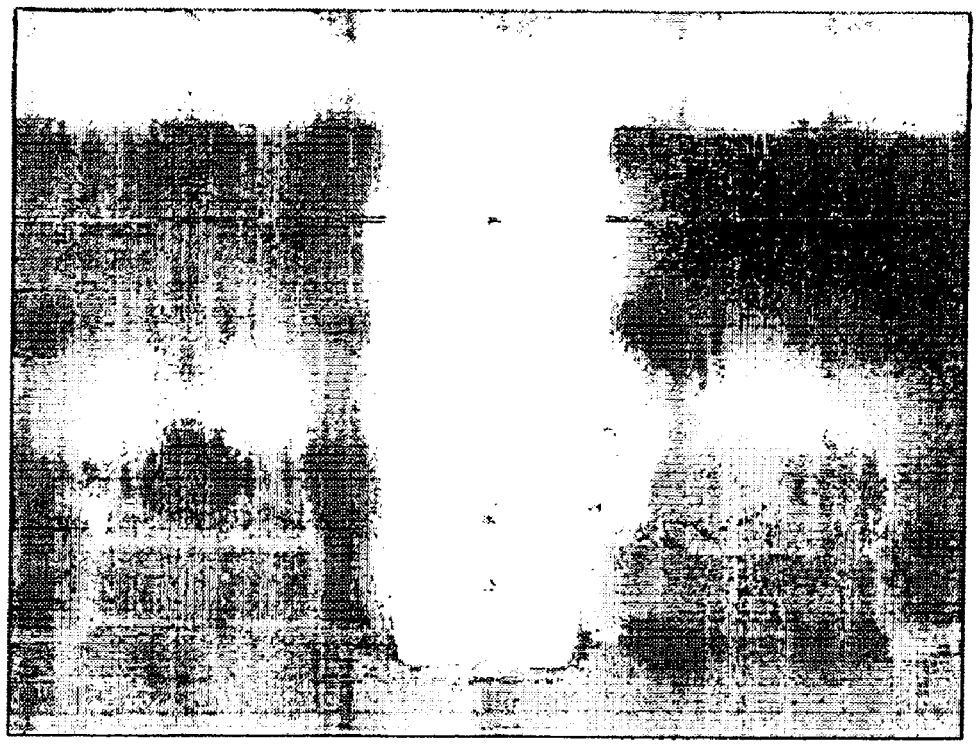
FIG. 2 is an image of an actual memory cell of the prior art which has suffered a failure as a result of a short distance between the contact and the gate region thereof.

The test structures according to the present invention and a corresponding dedicated testing method are described in the following paragraphs. It should be noted that the present invention may be implemented with numerous integrated circuit manufacturing techniques currently used in the art, and only those common process steps necessary for an understanding of the invention will be discussed herein. It should also be noted that the drawing figures which show cross-sections through a semiconductor wafer are not drawn to scale, but rather are enlarged to highlight pertinent features thereof.

Moreover, the following detailed description makes reference to non-volatile FLASH memory devices for illustrational purposes. However, it will be appreciated by those skilled in the art the present invention is equally applicable to other memory devices as well, such as, for example, EPROM and EEPROM devices.

Figure 3:
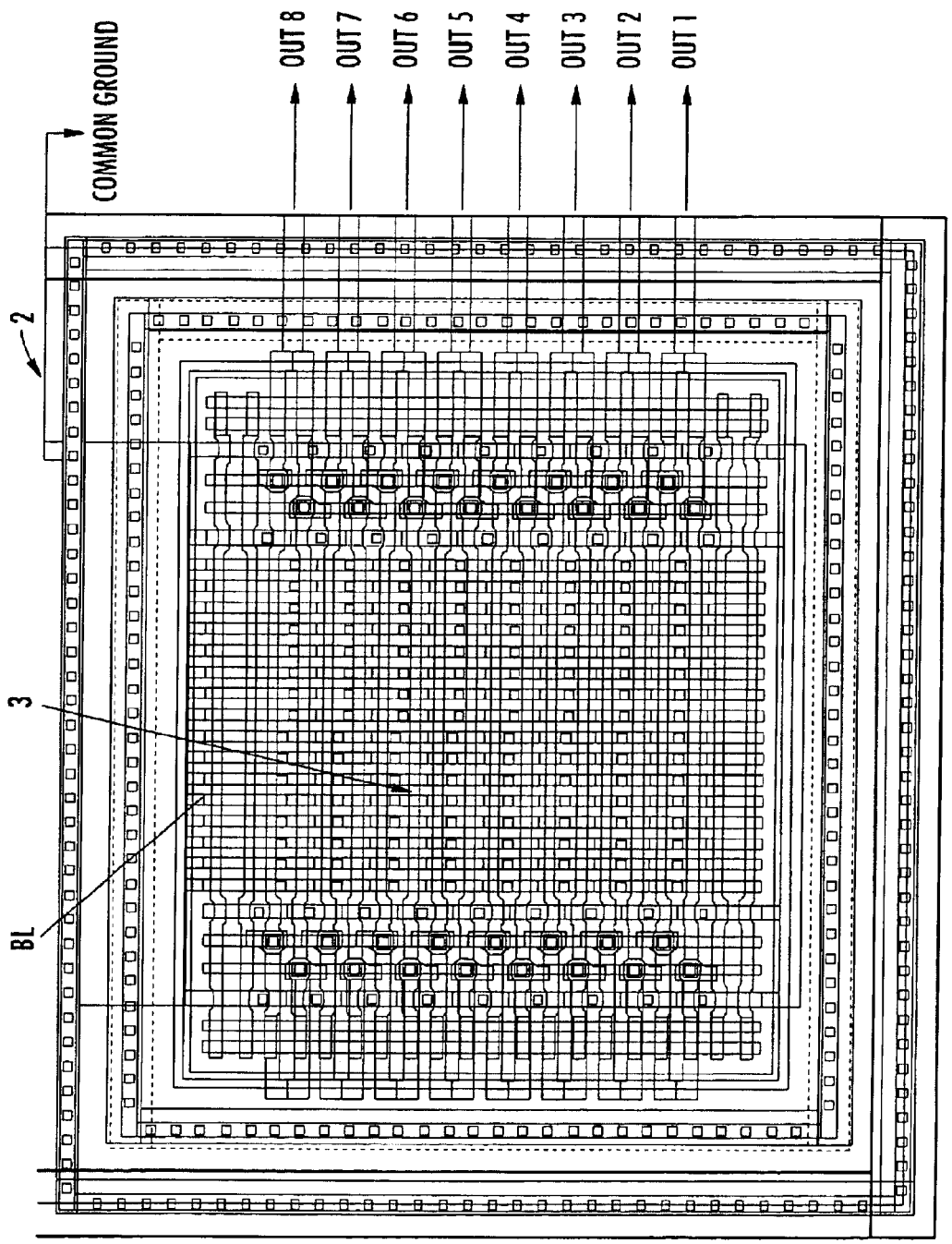
FIG. 3 is a schematic top view of a memory device according to the present invention.
Figure 4:
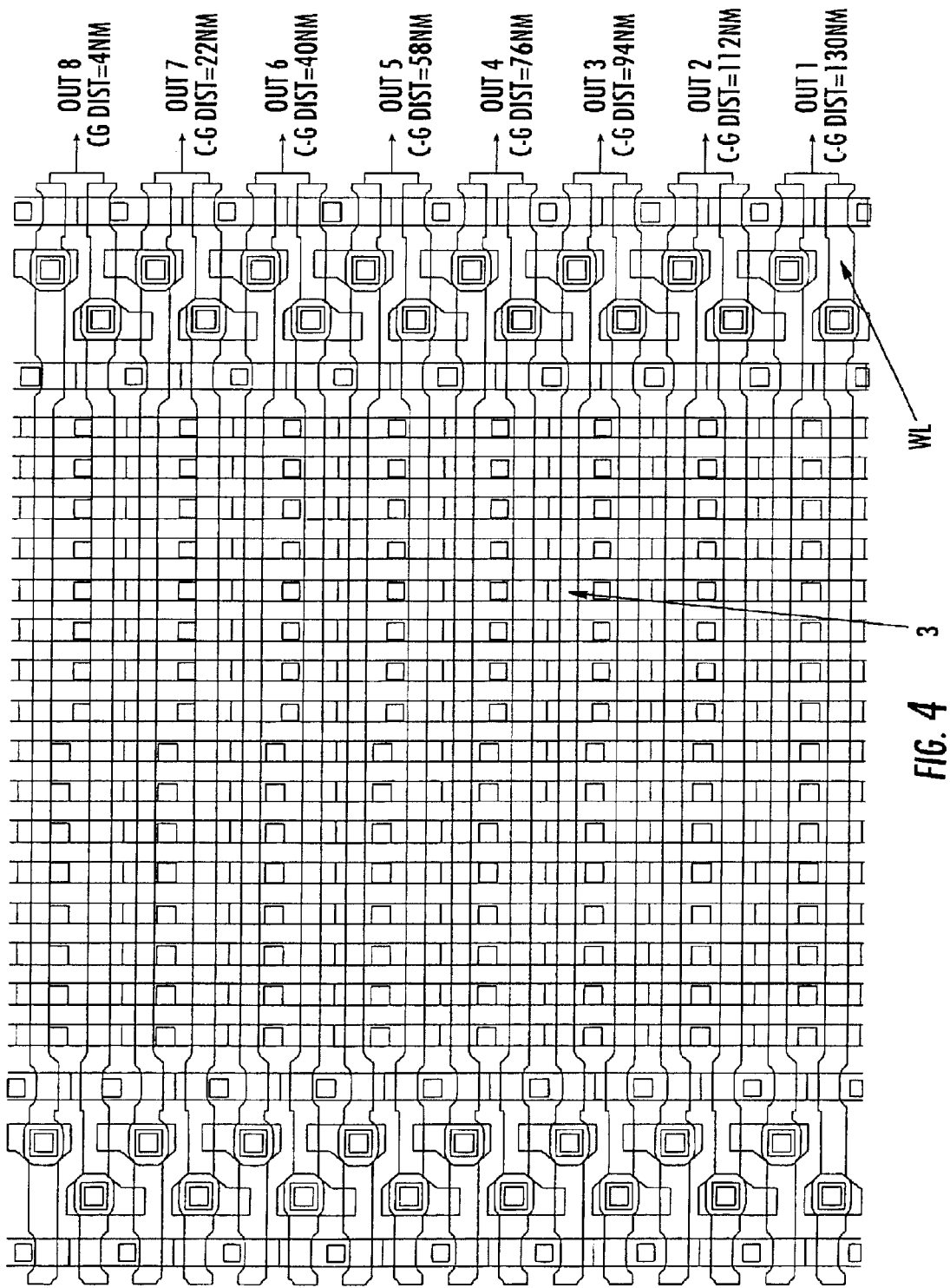
FIG. 4 is a schematic and enlarged view of a portion of the memory device of FIG. 3.
Figure 5:
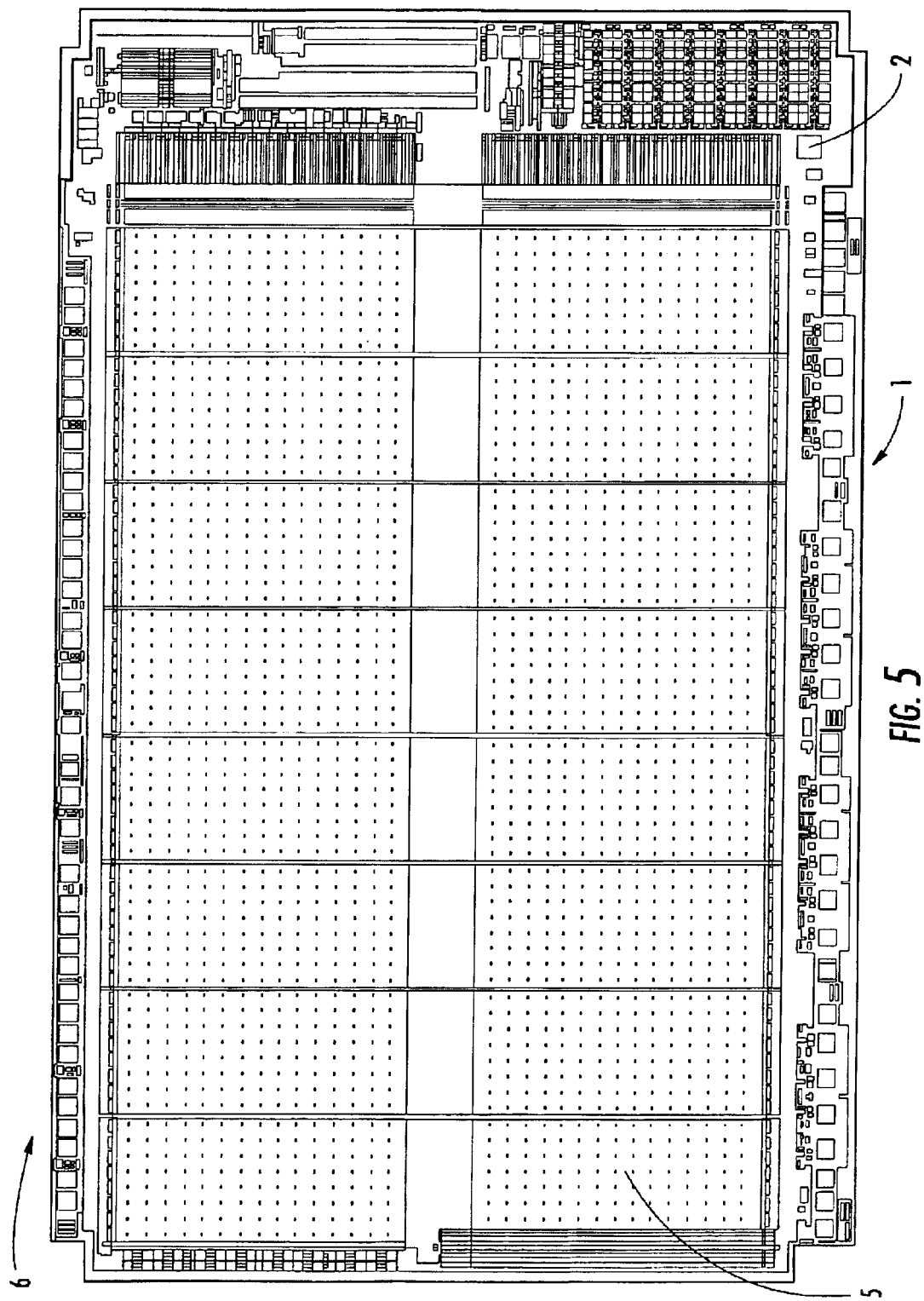
FIG. 5 is a schematic top view of an integrated memory including the memory device of FIG. 3.

Referring now to FIGS. 3–5, a memory device 1 with a matrix 5 of memory cells including rows and columns of non-volatile memory cells is illustratively shown. When using CMOS technology, the rows of the flash cell matrices are formed in low-resistivity polysilicon. In technological processes providing for two or three metal levels, the polysilicon lines can be parallel-connected to metal lines. This is done to reduce the overall parasitic resistance of the rows and, hence, the propagation delays, according to a technique known as word line metal strapping.

In any case, the conductive layers providing the matrix rows have to be formed within the word line pitch, that is, placed at sub-micron distances from one another. This feature makes two rows in physical contact with each other a statistically likely event which may result in shorts at one or more locations.

With current integration technologies providing a high degree of control of the lithographic patterning, the spread of faults from the rows of conductive layers becomes restricted to isolated punctual regions of the matrix. Furthermore, faults are more prevalent in the polysilicon lines than the metal-polysilicon lines.

According to the present invention, a test structure 2 is integrated into the memory device 1. Advantageously, the test structure 2 is used for contact to gate distance evaluation during an EWS test. The test structure 2 includes a small array of FLASH cells designed like the main memory matrix 5 inside the integrated memory device 6, as illustratively shown in FIG. 5. This array of cells may be considered a second matrix 3 having a smaller size than the main matrix 5. Yet, even though the second matrix 3 has a smaller size than the main matrix 5 in the illustrated example, other configurations are also possible.

More particularly, the structure illustratively shown in FIG. 3 includes an array of 12 rows×16 columns with two source lines (Vss). Its size is approximately 17 $\mu$m×15 $\mu$m. This structure 2 can be easily inserted into any device layout, since its size is lower than the dimension of a single contact pad.

All bit lines BL and source lines SL of the matrix 3 may be connected to a common electrode. However, the second matrix 3 may advantageously work even if only the bit lines or the source lines are connected to a common reference potential.

Word lines WL are coupled to corresponding contacts, and each coupling differs from the neighboring or adjacent ones with respect to its distance to the corresponding contact. That is, the contacts are designed with an appropriate misalignment toward the gate regions. In other words, each coupling of word lines has an increasing contact-to-gate distance that gradually varies from coupling to coupling. Exemplary amounts of misalignment are listed in FIG. 4 for corresponding couplings of word lines.

Furthermore, the same misalignment is applied to the drain contacts and/or to the source contacts in both up and down directions to avoid random compensation due to process misalignment. Each word line coupling is connected to a different output line (in the illustrated example there are eight output lines, as shown in FIG. 4, namely Out 1, Out 2, . . . , Out 8).

According to the exemplary test structure, it is possible to implement a test method for evaluating the effective contact to gate distance on the memory device. Each word line output is tested separately, applying a potential bias with respect to common voltage reference (e.g., ground GND). The resulting current is measured, which is the leakage of the selected gates.

As an arbitrary convention, a test result can be classified as "1" if the measured current overcomes a defined limit Iref, and otherwise as "0". The test results are included or joined into an eight-bit string corresponding to the eight different word line coupling outputs. For example, if the test of the structure shown in FIG. 4 gives a result 00000111, this means that all the word lines outputs with a "nominal" contact to gate distance below 40 nm have a leakage higher than the defined Iref.

From this result it can be deduced that the misalignment between contact and gate of the device that contains this test structure is 40 nm. Consequently, its effective contact to gate distance on silicon can be estimated as nominal distance minus 40 nm.

It should be noted that below a minimum dielectric thickness $Th_{MIN}$ there is a leakage current through the dielectric. Considering the first leaky structure (output n) with contact to gate distance equal to D, its real contact to gate misalignment will be $D-Th_{MIN}$. Thus, in the present example the real contact to gate distance can be calculated as the nominal distance minus 40 nm plus $Th_{MIN}$.

Proceeding with testing from Out 1 to Out 8, it may reasonably be assumed that all the outputs that follow the first leaky word line (the first "1") will drive current since they have a smaller contact to gate distance. Thus, they will be classified as "1" too.

Consequently each device can be easily classified with a number N that is the sum of the eight bits of its output string. In a range between 1 and 8, this number N represents intrinsic reliability level of the dielectric between contact and gate. This number can be used to classify devices according to the write/erase cycling requirements of the application, or to screen devices where contact to gate distance is lower than an acceptable value.

The test structure and method according to the present invention address the above-noted technical problem and provides many advantages. For example, a possible failure mode of the matrix of memory cells may be determined prior to use thereof. Moreover, as previously noted, according to the inventive test method it is possible to associate a numeric value N to the memory device. This value indicates the degree of reliability of the dielectric between the contact and the gate region. Such evaluation would not be possible according to prior art methods.

Thus, the proposed test structure of the present invention allows monitoring with a large statistic one of the most critical technology parameters for FLASH reliability. The test structure has the same layout as a real FLASH array. Moreover, the test structure may be easily inserted into any device layout since its size is lower than the dimension of a single pad.

In addition, testing may be performed easily and rapidly during EWS. Each device can be classified according to the write/erase cycling requirements of the application, or devices device may be screened to determine where contact to gate distance is lower than an acceptable value.

It should also be noted that the test structure may also advantageously be used to monitor similar problems for numerous other applications. Moreover, the inventive structure may be realized in a dual version. That is, the word lines may be connected to a common terminal while maintaining separate bit lines. Each bit line is associated with a corresponding contact having a predetermined distance to the gates. The testing phase may be performed by applying a bias potential on a single bit line and detecting the flowing current.

The testing phase may proceed in this manner to sequentially check the other bit lines having different contact to gate distances. The results of the testing phase may be treated in the same manner noted above with reference to the contact to gate distance of the word lines.

That which is claimed is:

1. A non-volatile memory device comprising:
   a primary memory array comprising a plurality of first memory cells;

a plurality of output lines connected to said first memory cells; and a test memory array comprising a plurality of second memory cells each having at least one control terminal, a plurality of signal lines connected to said plurality of output lines, and a plurality of contacts connecting said signal lines to said second memory cells, distances between control terminals and respective contacts being different for said second memory cells.

2. The memory device of claim 1 wherein said test memory array has a smaller surface area than said primary memory array.

3. The memory device of claim 1 wherein the distances between said control terminals and respective contacts successively increase between successive second memory cells.

4. The memory device of claim 1 wherein said contacts comprise first contacts and said signal lines comprise first signals lines; wherein said second memory cells further have at least one conduction terminal; wherein said test memory array further comprises a plurality of second signal lines and second contacts connecting said plurality of second signal lines to said second memory cells; and wherein a distance between each conduction terminal and a respective second contact is different for each of said memory cells.

5. The memory device of claim 1 wherein said test memory array further comprises at least one reference line connected to said second memory cells and to a reference signal.

6. The memory device of claim 5 wherein said at least one reference line comprises at least one bit line.

7. The memory device of claim 5 wherein said at least one reference line comprises at least one source line.

8. The memory device of claim 1 further comprising a contact pad connected to one of the output lines; and wherein a surface area of said second array is less than a surface area of said contact pad.

9. The memory device of claim 1 wherein each of said signal lines is connected to respective ones of said output lines.

10. The memory device of claim 1 wherein said signal lines comprise word lines.

11. The memory device of claim 1 wherein said first memory cells are arranged in rows and columns; and further comprising:

row and column decoding circuits respectively connected to the rows and columns of said first memory cells;

write circuitry for writing data to said first memory cells; and read circuitry for reading data from said first memory cells.

12. A non-volatile memory device comprising:

a primary memory array comprising a plurality of first memory cells;

a plurality of output lines connected to said first memory cells; and a test memory array comprising a plurality of second memory cells each having at least one control terminal, a respective signal line connected to each of said output lines, and a plurality of contacts connecting said signal lines to said second memory cells;

distances between control terminals and respective contacts successively increasing between successive second memory cells.

13. The memory device of claim 12 wherein said test memory array has a smaller surface area than said primary memory array.

14. The memory device of claim 12 wherein said contacts comprise first contacts and said signal lines comprise first signals lines; wherein said second memory cells further have at least one conduction terminal; wherein said test memory array further comprises a plurality of second signal linen and second contacts connecting said plurality of second signal lines to said second memory cells; and wherein a distance between each conduction terminal and a respective second contact is different for each of said memory cells.

15. The memory device of claim 12 wherein said teat memory array further comprises at least one reference line connected to said second memory cell and to a reference signal.

16. The memory device of claim 15 wherein said at least one reference line comprises at least one bit line.

17. The memory device of claim 15 wherein said at least one reference line comprises at least one source line.

18. The memory device of claim 12 wherein said signal lines comprise word lines.

* * * * *